United States Patent
Su et al.

(10) Patent No.: US 7,652,536 B2
(45) Date of Patent: Jan. 26, 2010

(54) AMPLIFIER CIRCUIT WITH INTERNAL ZEROS

(75) Inventors: Hung-Der Su, Jhudong Township, Hsinchu County (TW); Jing-Meng Liu, Jhubei (TW); An-Tung Chen, Pingjen (TW); Pao-Chuan Lin, Lunbei Township, Yunlin County (TW)

(73) Assignee: Richtek Technology Corp., Hsinchu (TW)

( * ) Notice: Subject to any disclaimer, the term of this patent is extended or adjusted under 35 U.S.C. 154(b) by 51 days.

(21) Appl. No.: 12/068,774

(22) Filed: Feb. 12, 2008

(65) Prior Publication Data
US 2008/0211581 A1 Sep. 4, 2008

(30) Foreign Application Priority Data
Feb. 16, 2007 (TW) .............................. 96106018 A

(51) Int. Cl.
*H03F 3/45* (2006.01)
*H03F 1/14* (2006.01)
(52) U.S. Cl. ...................................... 330/260; 330/292
(58) Field of Classification Search ................. 330/107, 330/109, 260, 292
See application file for complete search history.

(56) References Cited

U.S. PATENT DOCUMENTS 6,084,469 A * 7/2000 Lorenz ........................ 330/252
6,822,514 B1 * 11/2004 Aude .......................... 330/260

* cited by examiner

*Primary Examiner*—Steven J Mottola
(74) *Attorney, Agent, or Firm*—Rosenberg, Klein & Lee

(57) ABSTRACT

An amplifier circuit with internal zeros provides a second pole in addition to a first pole and two zeros such that the second pole can prevent excessive gain at high frequency, so as to have high-frequency noise under control.

11 Claims, 9 Drawing Sheets

AMPLIFIER CIRCUIT WITH INTERNAL ZEROS

FIELD OF THE INVENTION

The present invention is related generally to an amplifier circuit and, more particularly, to an amplifier circuit with internal zeros.

BACKGROUND OF THE INVENTION

As described in U.S. Pat. No. 6,737,841 to Wrathall, closed loop negative feedback systems are commonly employed in linear integrated circuits. For instance, switching regulators use a feedback loop to monitor the output voltages in order to provide regulation. To ensure stability in any closed loop system, the Nyquist Criterion must be met. The Nyquist Criterion states that a closed loop system is stable if the phase shift around the loop is less than 180 degrees at unity gain. Typically, a compensation circuit is added to a feedback loop to modulate the phase shift of the feedback loop to obtain stability. For example, as shown in FIG. 1, a traditional switching regulator 100 comprises a controller 102 and an LC filter 104. In the controller 102, an output control logic 108 drives a switching transistor 106 according to an input voltage $V_{IN}$ and an output of a comparator 114, in order to generate a switching voltage $V_{SW}$ for the LC filter 104 to further generate a regulated output voltage $V_{OUT}$. The output voltage $V_{OUT}$ is divided by voltage divider composed of resistors R1 and R2 to produce a voltage $V_R$, and an error amplifier 112 compares the divided voltage $V_R$ with a reference voltage $V_{Ref}$ so as to produce an error output for the comparator 114. The feedback control loop of the controller 102 operates to regulate the output voltage $V_{OUT}$ based on the error output of the error amplifier 112 so that the divided voltage $V_R$ equals the reference voltage $V_{Ref}$. The frequency response of a linear circuit can be characterized by the presence of "poles" and "zeros". Generally speaking, a pole provides a phase shift of −90 degrees and a zero provides a phase shift of +90 degrees. Any person skilled in the art should understand that the error amplifier 112 in the switching regulator 100 has a pole and a zero, and the LC filter 104 provides double-pole. FIG. 2 is a plot of the loop gain magnitude vs. frequency in log scale for the switching regulator 100 of FIG. 1 without any compensation. As shown in FIG. 2, without compensation, the effect of the double-pole in the LC filter 104 causes a large loss in the loop gain such that the phase shift at unity gain is equal to or greater than 180 degrees. Therefore, the feedback control loop of the uncompensated switching regulator 100 of FIG. 1 is unstable unless the gain is substantially reduced.

As shown in FIG. 1, to compensate the double-pole of the LC filter 104 for a stable switching regulator 100, conventionally, a capacitor 110 (typically referred to as a "zero capacitor") is connected in parallel to the resistor R1 of the voltage divider. The capacitor 110 introduces a zero-pole pair in the feedback loop, and the location (or frequency) of the zero-pole pair is determined by the resistance of the voltage divider and the capacitance of the zero capacitor 110. Here, the operation of the zero capacitor 110 ensures that the phase shift is less than 180 degrees near unity gain. FIG. 3 is a plot of the loop gain magnitude vs. frequency in log scale for the switching regulator 100 of FIG. 1 incorporating the zero capacitor 110. From the circuit shown in FIG. 1, it is known that the capacitor 110 provides the zero $$\text{Zero}=1/(C \times R1),\qquad\qquad\qquad\text{[Eq-1]}$$

where C is the capacitance of the zero capacitor 110, and the LC filter 104 has the pole $$\text{Pole}=[1/(C \times R1)] \times (V_{OUT}/V_R).\qquad\qquad\text{[Eq-2]}$$

Thereupon, the ratio of the pole to zero is limited to $V_{OUT}/V_R$.

U.S. Pat. No. 6,737,841 to Wrathall provides a zero generating circuit, which uses a gain amplifier to improve the ratio of the pole to zero.

There has been also proposed an amplifier circuit with internal zeros to compensate the double-pole of the LC filter 104 in the switching regulator 100 of FIG. 1. For example, a conventional amplifier circuit 200 with internal zeros is shown in FIG. 4, which comprises a differential input pair composed of voltage-controlled current sources 210 and 212 to generate currents I1 and I2 according to input voltages VN and VP, two current mirrors 202 and 204 to mirror the currents I1 and I2 to generate currents I3=N×I1 and I4=P×I2 respectively, and a further current mirror 206 to mirror the current I3 to determine a current I5=M×I3=N×M×I1, where N×M=P. In the case of VN=VP, there will have the result of I1=I2, and therefore I4=I5. In this case, no current is sourcing to or sinking from the load circuit which is represented by serially connected resistor Rcomp and capacitor Ccomp. In the case of VN≠VP, resulting in a difference between the currents I4 and I5, a non-zero voltage Vout is generated. The network of the resistor Rcomp and the capacitor Ccomp provides a pole $$\text{Pole1}=1/(2 \times \pi \times ro \times C\text{comp}),\qquad\qquad\text{[Eq-3]}$$

where ro is the output impedance of the amplifier circuit 200, and a zero $$\text{Zero1}=1/(2 \times \pi \times R\text{comp} \times C\text{comp}).\qquad\qquad\text{[Eq-4]}$$

Moreover, a zero generating circuit 208 is connected between the voltage-controlled current sources 210, 212 and a bias current source 214 to further provide a zero. The zero generating circuit 208 comprises a zero resistor Rzero1 connected between the voltage-controlled current source 210 and the bias current source 214, another zero resistor Rzero2 connected between the voltage-controlled current source 212 and the bias current source 214, and a zero capacitor Czero connected between the voltage-controlled current sources 210 and 212. Assuming that the resistance Rzero1 is equal to the resistance Rzero2, the network of the zero capacitor Czero and the zero resistors Rzero1 and Rzero2 provides a second zero $$\text{Zero2}=1/(2 \times \pi \times R\text{zero1} \times 2 \times C\text{zero}).\qquad\text{[Eq-5]}$$

FIG. 5 shows the frequency response of the amplifier circuit 200 with the parameters Rcomp=100 KΩ, Rzero1=Rzero2=230 KΩ, Ccomp=1 nF, and Czero=20 pF. In FIG. 5, the curve 216 represents the gain and the curve 218 represents the phase. As the curve 216 indicates, at the pole Pole1, i.e. 10 Hz, the gain begins to decrease, and until 1 KHz, the zero Zero1 counteracts the pole Pole1 such that the gain becomes stable. Then, at 10 KHz, due to the zero Zero2, the gain begins to increase. Though a switching regulator employing such amplifier circuit 200 eliminates the need of extra components to compensate the double-pole of the LC filter, the amplifier circuit 200 will bring significantly increased gain at high frequency and is therefore disadvantageous in controlling high-frequency noise.

Hence, a need exists for an amplifier circuit with internal zeros to facilitate controlling high-frequency noise.

SUMMARY OF THE INVENTION

It is an object of the present invention to provide an amplifier circuit with two zeros and two poles.

It is another object of the present invention to provide an amplifier circuit to facilitate controlling high-frequency noise at high frequency.

An amplifier circuit according to the present invention provides two zeros and two poles such that at high frequency, one of the poles may prevent excessive gain so as to control high-frequency noise.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
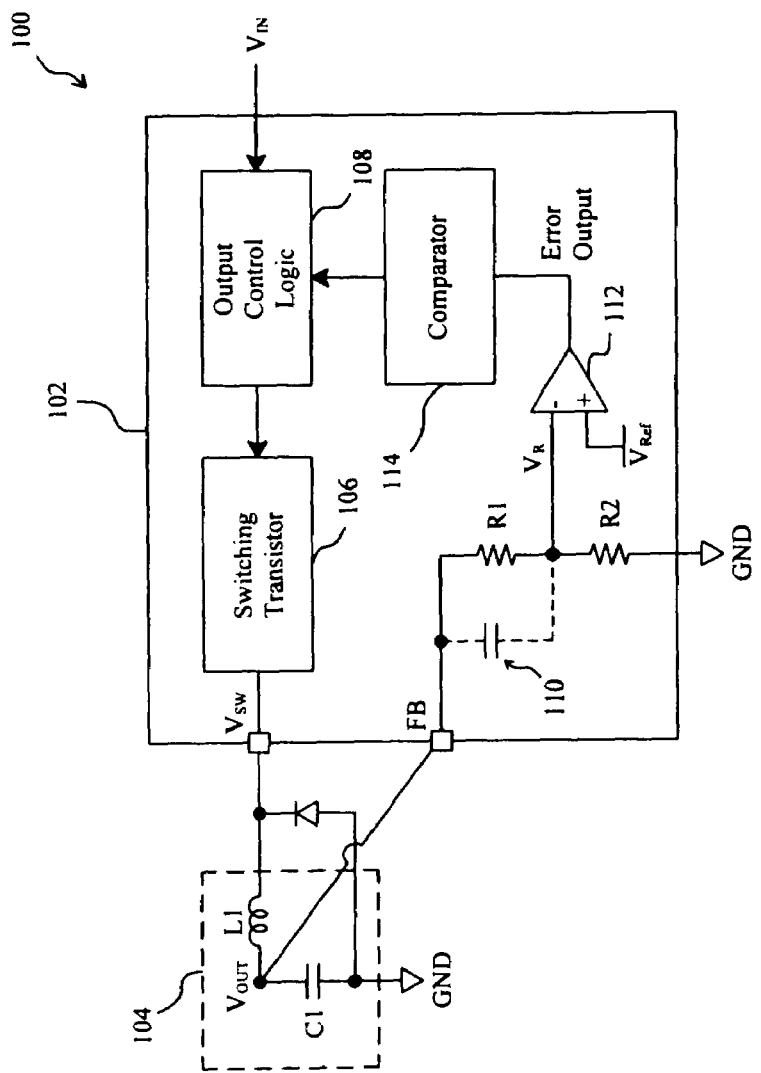
FIG. 1 is a circuit diagram of a traditional switching regulator.
Figure 3:
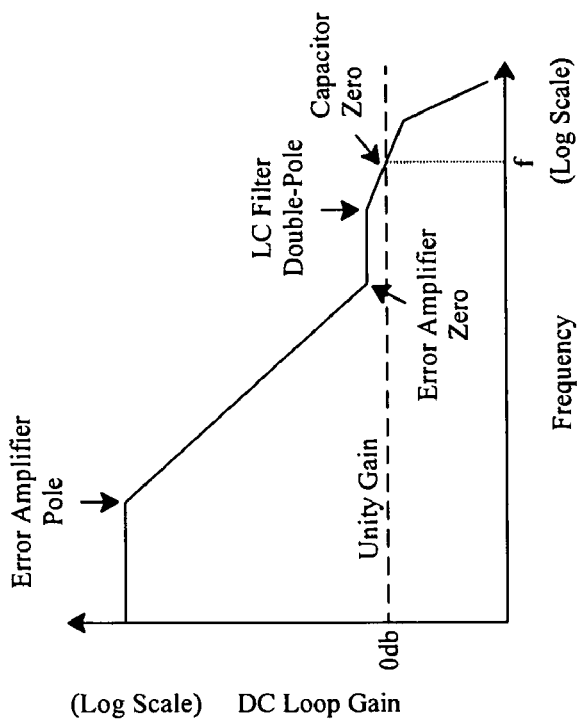
FIG. 3 is a plot of the loop gain magnitude vs. frequency in log scale for the switching regulator of FIG. 1 incorporating the zero capacitor shown in FIG. 1.
Figure 2:
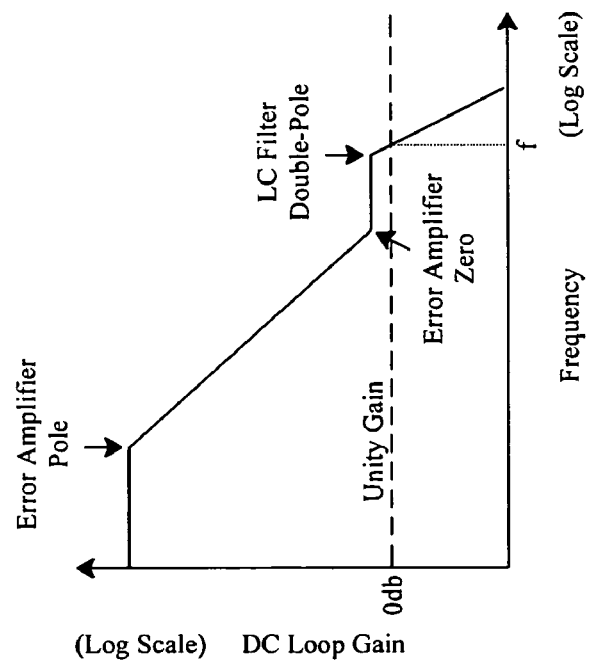
FIG. 2 is a plot of the loop gain magnitude vs. frequency in log scale for the switching regulator of FIG. 1 without any compensation.
Figure 4:
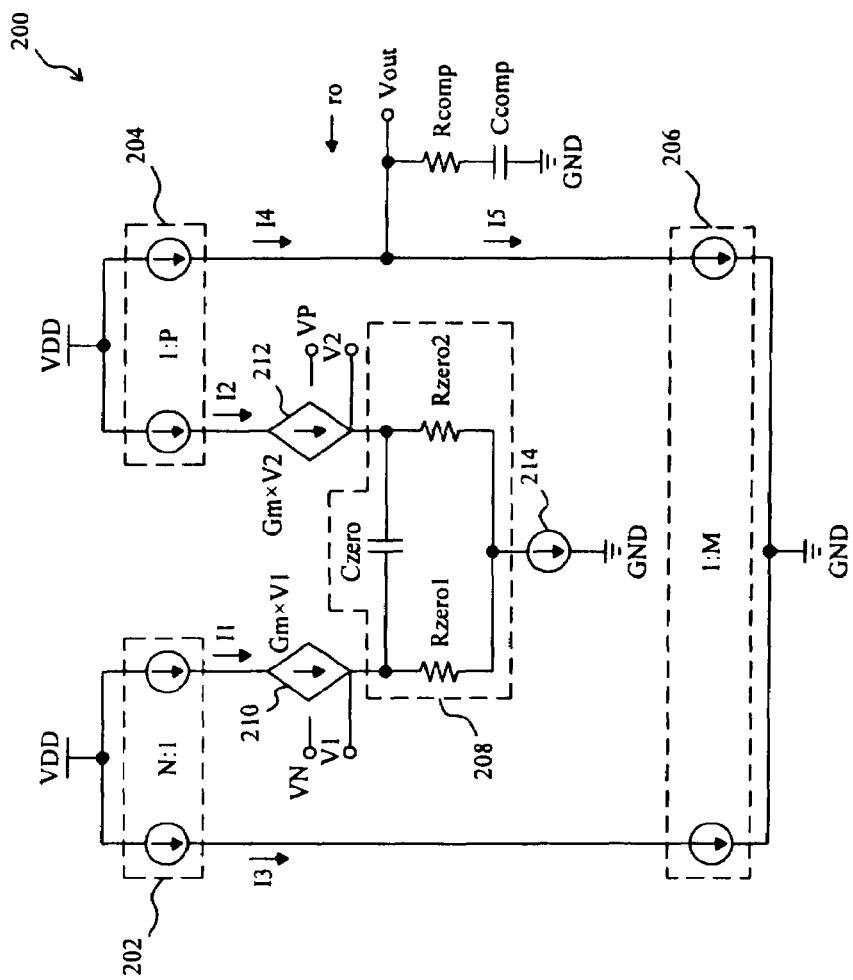
FIG. 4 is a circuit diagram of a conventional amplifier circuit with internal zeros.
Figure 5:
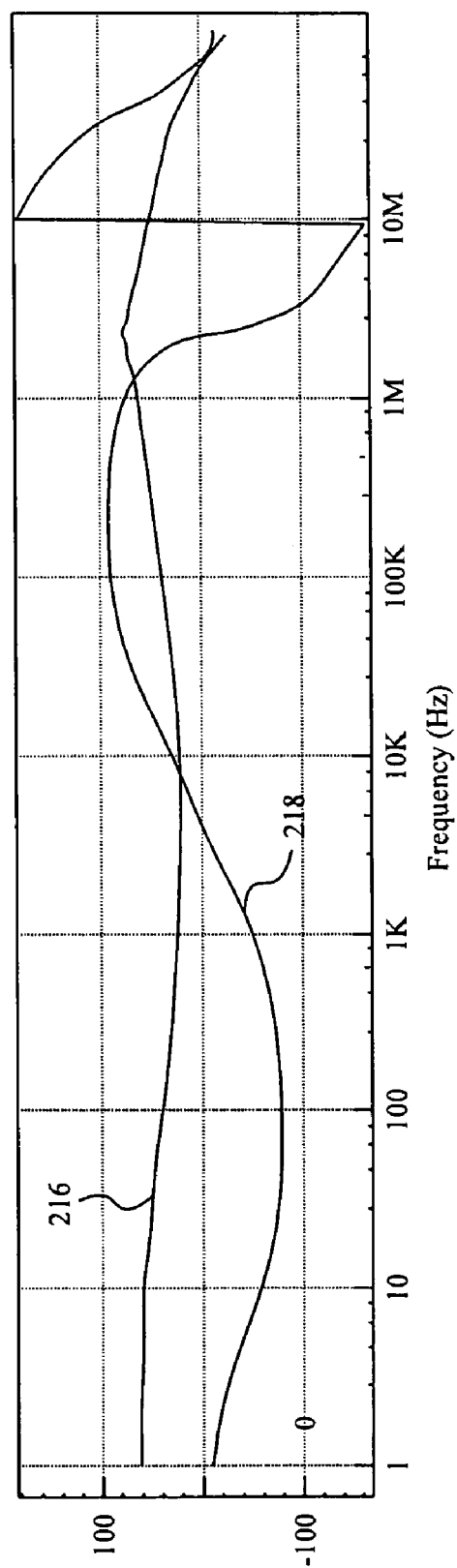
FIG. 5 shows a frequency response of the amplifier circuit of FIG. 4.
Figure 6:
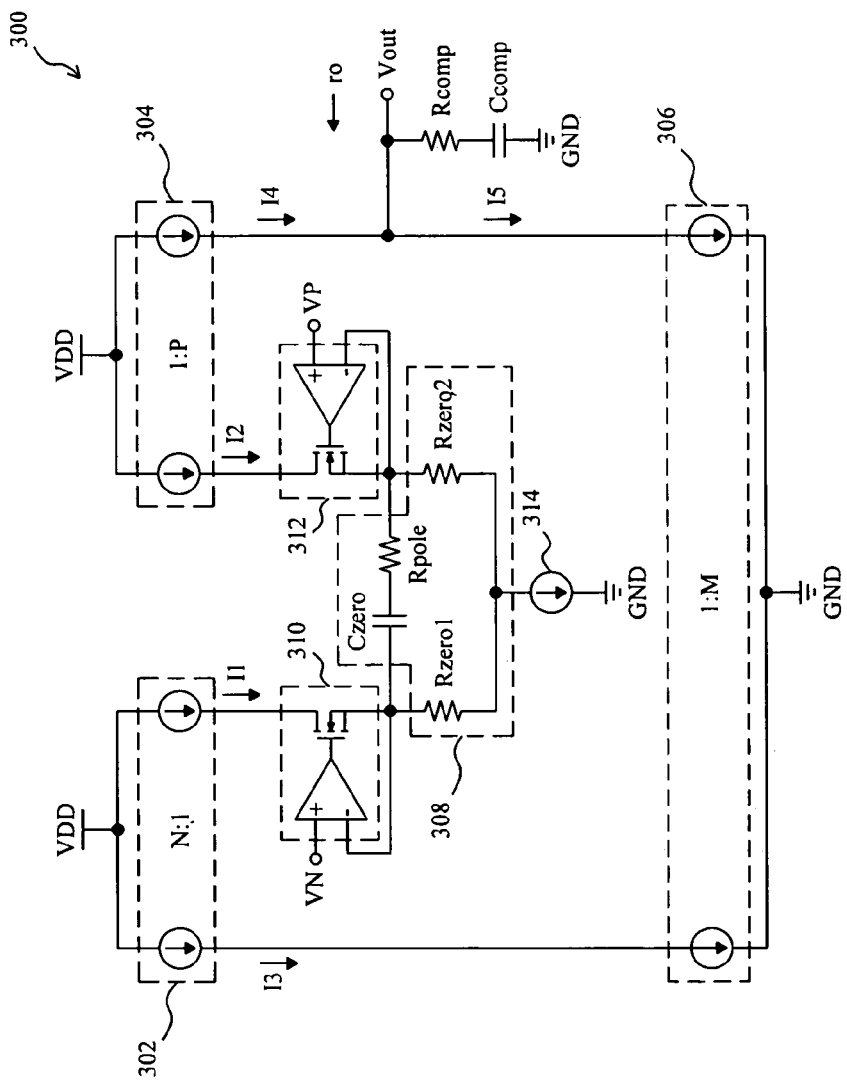
FIG. 6 is a circuit diagram of a first embodiment according to the present invention.

FIG. 6 provides a first embodiment according to the present invention, in which an amplifier circuit 300 comprises a differential input pair composed of voltage-controlled current sources 310 and 312 to generate currents I1 and I2 according to input voltages VN and VP, two current mirrors 302 and 304 to mirror the currents I1 and I2 to generate currents I3=N×I1 and I4=P×I2 respectively, a further current mirror 306 to mirror the current I3 to determine a current I5=M×I3=N×M×I1, where N×M=P, and a load circuit composed of serially connected resistor Rcomp and capacitor Ccomp to generate an output voltage Vout based on a difference between the currents I4 and I5. The network of the resistor Rcomp and the capacitor Ccomp provides a pole Pole1 and a zero Zero1 as shown in the equations Eq-3 and Eq-4 respectively. A zero-pole generating circuit 308 is further comprised in the amplifier circuit 300, which is connected between the differential input pair and a bias current source 314, in order to provide a second zero Zero2 and a second pole Pole2. The zero-pole generating circuit 308 includes a zero capacitor Czero and a pole resistor Rpole serially connected between the voltage-controlled current sources 310 and 312, a zero resistor Rzero1 connected between the voltage-controlled current source 310 and the bias current source 314, and another zero resistor Rzero2 connected between the voltage-controlled current source 312 and the bias current source 314. Assuming that the resistance Rzero1 is equal to the resistance Rzero2, then the network of the capacitor Czero and the resistors Rzero1 and Rzero2 will provide the second zero as shown in the equation Eq-5, and the network of the capacitor Czero and the resistor Rpole will provide the second pole $$\text{Pole2} = 1/(2 \times \pi \times R\text{pole} \times C\text{zero}). \quad [\text{Eq-6}]$$

Figure 7:
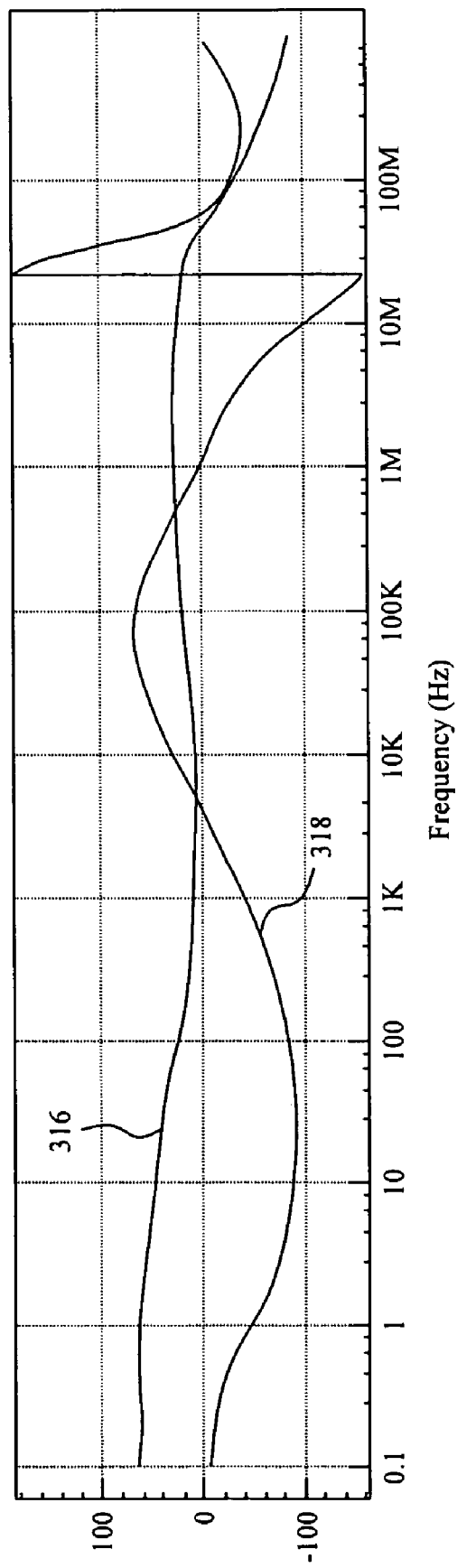
FIG. 7 shows a frequency response of the amplifier circuit of FIG. 6.

FIG. 7 shows the frequency response of the amplifier circuit 300 of FIG. 6 with the parameters Rcomp=33KΩ, Rzero1=Rzero2=230 KΩ, Rpole=23 KΩ, Ccomp=5 nF, and Czero=20 pF. In FIG. 7, the curve 316 represents the gain and the curve 318 represents the phase. As the curve 316 indicates, from the position of 1 Hz, due to the pole Pole1, the gain begins to decrease, and at the position of 1 KHz, the zero Zero1 counteracts the pole Pole1 and thus the gain becomes stable. Then, at the position of 10 KHz, the zero Zero2 causes the gain to rise again, and at the position of 200 KHz, the pole Pole2 counteracts the zero Zero2 and thus the gain becomes stable. As shown in the simulation of FIG. 7, at high frequency, the pole Pole2 restricts the gain from keeping increasing, and thereby prevents excessive gain that leads to uncontrollable high-frequency noise. That is, the high-frequency noise is retained in a controllable stage. In addition, the ratio of the pole Pole2 to the zero Zero2 in the amplifier circuit 300 only relates to Rzero/Rpole, and it would be very facile to devise a switching regulator employing the amplifier circuit 300.

Figure 8:
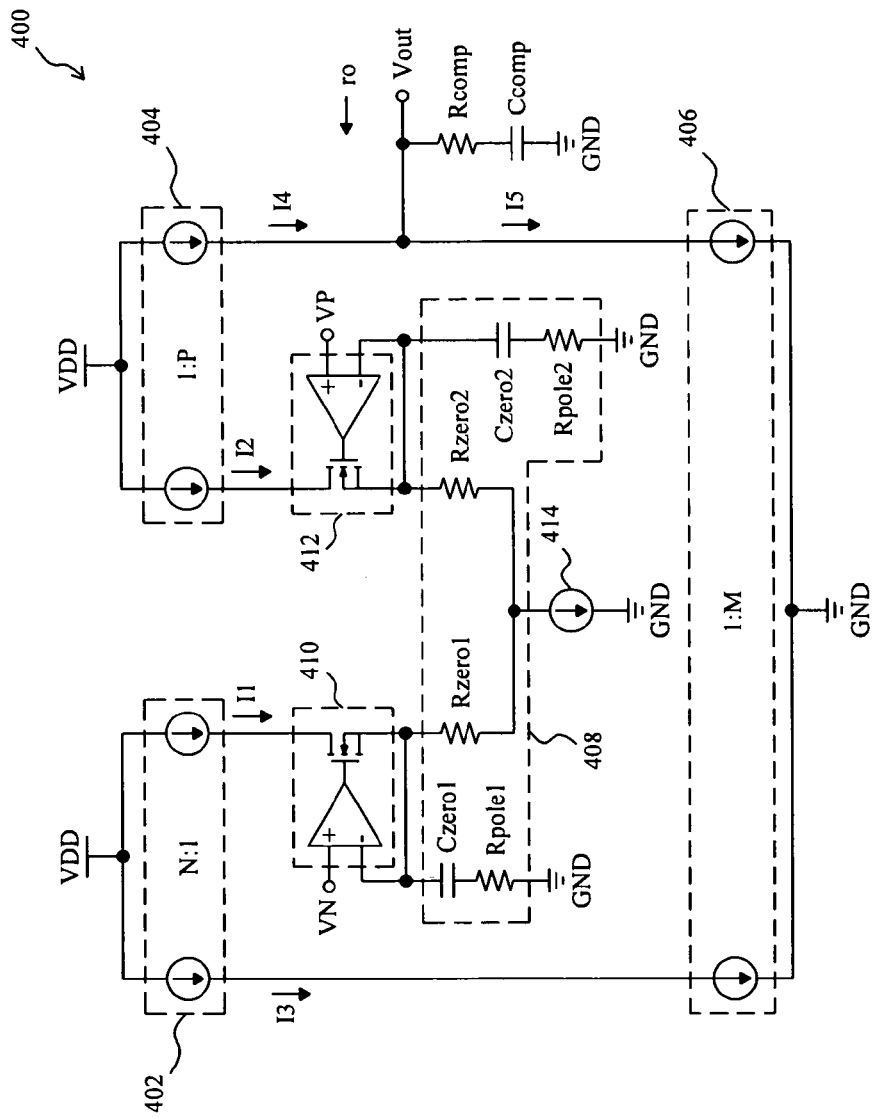
FIG. 8 is a circuit diagram of a second embodiment according to the present invention.

According to a second embodiment shown in FIG. 8, an amplifier circuit 400 comprises a differential input pair composed of voltage-controlled current sources 410 and 412 to generate currents I1 and I2 according to input voltages VN and VP, two current mirrors 402 and 404 to mirror the currents I1 and I2 to generate currents I3 and I4 respectively, a further current mirror 406 to mirror the current I3 to determine a current I5, and a load circuit composed of serially connected resistor Rcomp and capacitor Ccomp to generate an output voltage Vout based on a difference between the currents I4 and I5. The network of the resistor Rcomp and the capacitor Ccomp provides a pole Pole1 and a zero Zero1 as shown in the equations Eq-3 and Eq-4 respectively. A zero-pole generating circuit 408 is further comprised in the amplifier 400, which is connected between the differential input pair and a bias current source 414. In the zero-pole generating circuit 408, a zero resistor Rzero1 is connected between the voltage-controlled current source 410 and the bias current source 414, another zero resistor Rzero2 is connected between the voltage-controlled current source 412 and the bias current source 414, a zero capacitor Czero1 and a pole resistor Rpole1 are serially connected between the voltage-controlled current source 410 and a ground terminal GND, and another zero capacitor Czero2 and another pole resistor Rpole2 are serially connected between the voltage-controlled current source 412 and the ground terminal GND. Assuming that Rzero1=Rzero2, Rpole1=Rpole2=Rpole, and Czero1=Czero2=Czero, the zero-pole generating circuit 408 will provide a zero $$\text{Zero2} = 1/(2 \times \pi \times R\text{zero1} \times C\text{zero}) \quad [\text{Eq-7}]$$

and a pole Pole2 as shown in the equation Eq-6. At high frequency, the serially connected capacitor Czero1 and resistor Rpole1, and the serially connected capacitor Czero2 and resistor Rpole2, can provide current paths so that the currents I1 and I2 are free from being limited by the resistances of the resistors Rzero1 and Rzero2, and the pole Pole2 can prevent the amplifier circuit 400 from excessive gain at high frequency, so as to have high-frequency noise under control.

Figure 9:
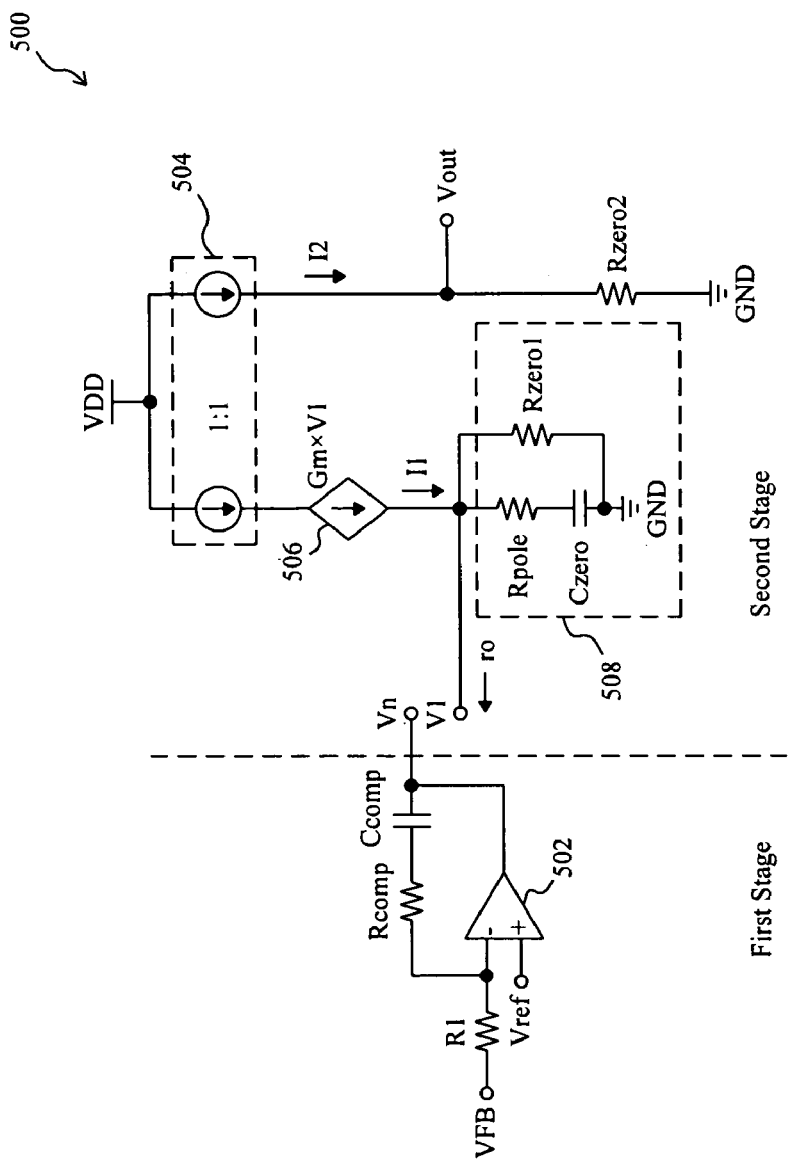
FIG. 9 is a circuit diagram of a third embodiment according to the present invention.

As shown in FIG. 9, in a third embodiment according to the present invention, an amplifier circuit 500 comprises two stages. In the first stage, an operational amplifier 502 has its inverting input connected with a voltage VFB and its non-inverting input connected with a reference voltage Vref, and a resistor Rcomp and a capacitor Ccomp constitutes a feedback circuit connected between the inverting input and an output of the operational amplifier 502. The network of the resistor Rcomp and the capacitor Ccomp provides a pole Pole1 and a zero Zero1 as shown in the equations Eq-3 and Eq-4 respectively. In the second stage, a voltage-controlled current source 506 provides a current I1 according to a voltage V1, and a zero-pole generating circuit 508 is connected to the voltage-controlled current source 506. The zero-pole generating circuit 508 includes a pole resistor Rpole and a zero capacitor Czero serially connected between the voltage-controlled current source 506 and a ground terminal GND, and a zero resistor Rzero1 shunt to the serially connected resistor Rpole and capacitor Czero. Further, a current mirror 504 mirrors the current I1 to generate a current I2 for a zero resistor Rzero2 to generate an output voltage Vout. Assuming that the resistance Rzero1 is equal to the resistance Rzero2, it is derived that the second stage of the amplifier circuit 500 provides a pole Pole2 and a zero Zero2 as shown in the equations Eq-6 and Eq-7 respectively. Similarly to the above embodiments, the pole Pole2 will have high-frequency noise under control.

Figure 10:
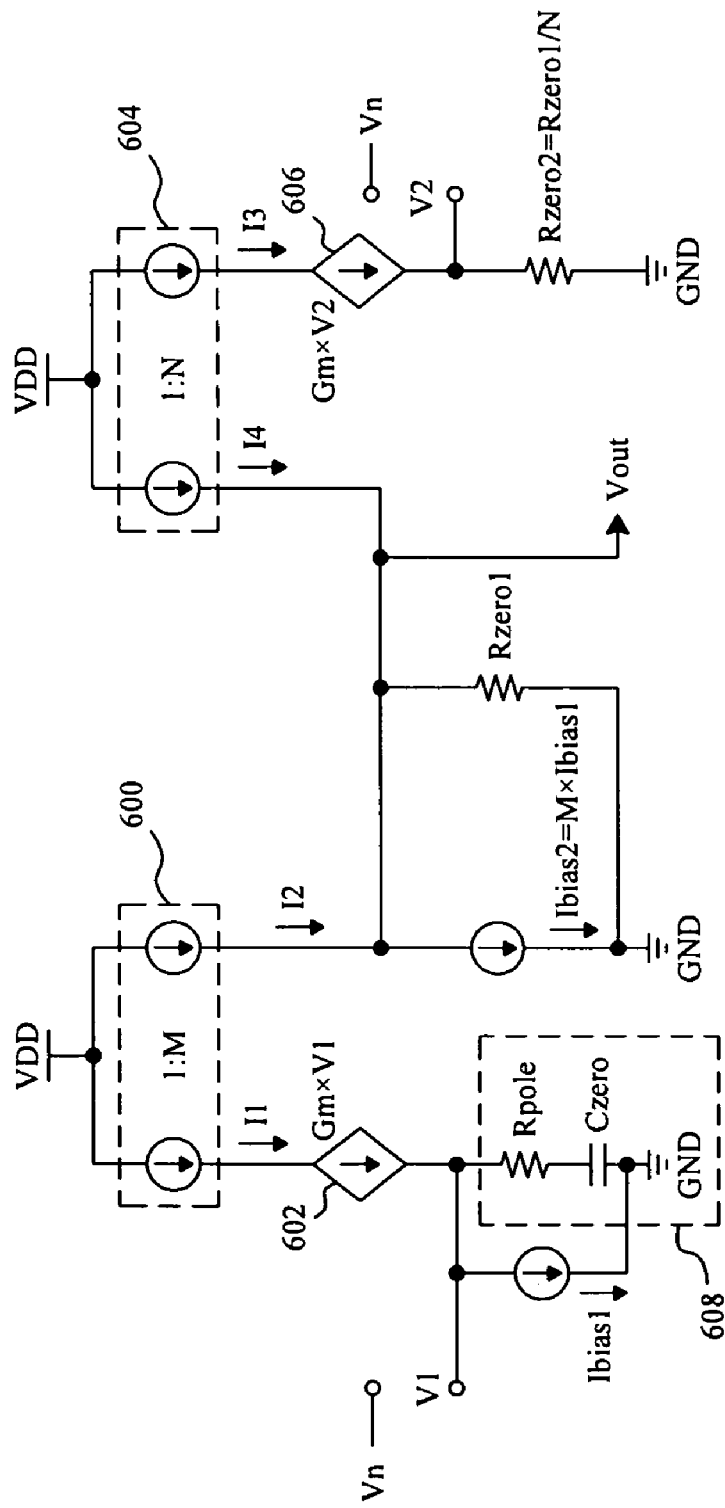
FIG. 10 provides another embodiment for the second stage in the amplifier circuit of FIG. 9.

FIG. 10 provides another embodiment for the second stage of the amplifier circuit 500 shown in FIG. 9, in which a voltage-controlled current source 602 generates a current I1 according to the voltage V1, and a zero-pole generating circuit 608 is connected to the voltage-controlled current sources 602. The zero-pole generating circuit 608 includes a pole resistor Rpole and a zero capacitor Czero serially connected between the voltage-controlled current sources 602 and a ground terminal GND. A current mirror 600 mirrors the current I1 to generate a current I2. Another voltage-controlled current source 606 generates a current I3 according to a voltage V2, and a zero resistor Rzero2 is connected between the voltage-controlled current source 606 and the ground terminal GND. Another current mirror 604 mirrors the current I3 to generate a current I4, and a zero resistor Rzero1 generates an output voltage Vout according to the currents I2 and I4. The zero-pole generating circuit 608 provides a pole Pole2 as shown in the equation Eq-6 and a zero $$Zero2=1/(2\times\pi\times Rzero1\times M\times Czero). \quad [Eq\text{-}8]$$

From the equation Eq-8, it is learned that the zero capacitor Czero in this embodiment only needs a magnitude M-fold less than that of the above embodiments. Similarly to the above embodiments, the pole Pole2 facilitates controlling high-frequency noise.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:
1. An amplifier circuit with internal zeros, comprising:
a bias current source for providing a first current;
a differential input pair in response to a first input voltage and a second input voltage, generating a second current and a third current;
a load circuit generating an output voltage according to a difference between the second current and the third current, and providing a first zero and a first pole; wherein the load circuit comprises a resistor and a capacitor connected in series; and
a zero-pole generating circuit connected between the bias current source and the differential input pair, providing a second zero and a second pole.

2. The amplifier circuit of claim 1, wherein the zero-pole generating circuit comprises:
a first zero resistor connected between the bias current source and the first one of the differential input pair providing the second current;
a second zero resistor connected between the bias current source and the second one of the differential input pair providing the third current;
a zero capacitor for being together with the first zero resistor and the second zero resistor to provide the second zero; and
a pole resistor serially connected to the zero capacitor between the differential input pair, for being together with the zero capacitor to provide the second pole.

3. An amplifier circuit with internal zeros, comprising:
a bias current source for providing a first current;
a differential input pair in response to a first input voltage and a second input voltage, generating a second current and a third current;
a load circuit generating an output voltage according to a difference between the second current and the third current, and providing a first zero and a first pole; and
a zero-pole generating circuit connected between the bias current source and the differential input pair, providing a second zero and a second pole wherein said zero-pole generating circuit comprises:
a first zero resistor connected between the bias current source and the first one of the differential input pair providing the second current;
a second zero resistor connected between the bias current source and the second one of the differential input pair providing the third current;
a first zero capacitor and a first pole resistor serially connected to the first one of the differential input pair, but not on the current path including the first zero resistor; and
a second zero capacitor and a second pole resistor serially connected to the second one of the differential input pair, but not on the current path including the second zero resistor;
wherein the first and second zero capacitors and the first and second zero resistors provide the second zero, and the first and second zero capacitors and the first and second pole resistors provide the second pole.

4. An amplifier circuit with internal zeros, comprising:
a first stage for generating a first output voltage according to a difference between two input voltages, and for providing a first zero and a first pole; and
a second stage for amplifying the first output voltage to generate a second output voltage, and for providing a second zero and a second pole; wherein the first stage comprises:
an operational amplifier having two inputs for receiving the two input voltages, and an output for providing the first output voltage; and a feedback circuit connected between the output of the operational amplifier and one of the two inputs of the operational amplifier, for providing the first zero and the first pole.

5. The amplifier circuit of claim 4, wherein the feedback circuit comprises a capacitor and a resistor serially connected between the output of the operational amplifier and the one of the two inputs of the operational amplifier, for providing the first zero and the first pole.

6. The amplifier circuit of claim 4, wherein the second stage comprises:
   a current source for generating a voltage-controlled current according to the first output voltage, to further generate the second output voltage; and
   a zero-pole generating circuit connected to the current source, for providing the second zero and the second pole.

7. The amplifier circuit of claim 6, further comprising a current mirror for mirroring the voltage-controlled current to generate a mirror current for a resistor to generate the second output voltage.

8. The amplifier circuit of claim 6, wherein the zero-pole generating circuit comprises:
   a pole resistor and a zero capacitor serially connected to the current source, for providing the second pole; and
   a zero resistor shunt to the serially connected pole resistor and zero capacitor, for being together with the zero capacitor to provide the second zero.

9. The amplifier circuit of claim 4, wherein the second stage comprises:
   a first current source for generating a first current according to the first output voltage;
   a second current source for generating a second current according to the first output voltage;
   a zero-pole generating circuit connected to the first current source; and
   a zero resistor for generating the second output voltage according to the first and second currents.

10. The amplifier circuit of claim 9, further comprising:
    a first current mirror for mirroring the first current to generate a third current to flow to the zero resistor; and
    a second current mirror for mirroring the second current to generate a fourth current to flow to the zero resistor.

11. The amplifier circuit of claim 9, wherein the zero-pole generating circuit comprises:
    a zero capacitor connected to the first current source, for being together with the zero resistor to provide the second zero; and
    a pole resistor serially connected to the zero capacitor, for being together with the zero capacitor to provide the second pole.

* * * * *